(12) United States Patent
Ichikawa et al.

(10) Patent No.: US 8,926,864 B2
(45) Date of Patent: Jan. 6, 2015

(54) METHOD OF PRODUCING β-SIAION, β-SIAION, AND PRODUCTS USING THE SAME

(75) Inventors: Masayoshi Ichikawa, Tokyo (JP); Hideyuki Emoto, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 145 days.

(21) Appl. No.: 13/697,556

(22) PCT Filed: Apr. 21, 2011

(86) PCT No.: PCT/JP2011/059858
§ 371 (c)(1),
(2), (4) Date: Nov. 27, 2012

(87) PCT Pub. No.: WO2011/142228
PCT Pub. Date: Nov. 17, 2011

(65) Prior Publication Data
US 2013/0106277 A1    May 2, 2013

(30) Foreign Application Priority Data

May 13, 2010    (JP) ................................ 2010-110865

(51) Int. Cl.
*C09K 11/08*    (2006.01)
*C09K 11/59*    (2006.01)
(Continued)

(52) U.S. Cl.
CPC ............ *C09K 11/7729* (2013.01); *C04B 35/597* (2013.01); *C04B 35/6262* (2013.01); *C04B 35/6268* (2013.01); *C04B 35/64* (2013.01); *C09K 11/0883* (2013.01); *C09K 11/7734* (2013.01); *H05B 33/14* (2013.01); *C04B 2235/3217* (2013.01); *C04B 2235/3224* (2013.01); *C04B 2235/3418* (2013.01);
(Continued)

(58) Field of Classification Search
USPC .................................................. 252/301.4 F
See application file for complete search history.

(56) References Cited

U.S. PATENT DOCUMENTS

2007/0108896 A1*  5/2007  Hirosaki ....................... 313/506
2009/0050845 A1*  2/2009  Hirosaki et al. ........ 252/301.4 F
2009/0272995 A1   11/2009  Ito et al. .......................... 257/98

FOREIGN PATENT DOCUMENTS

EP    1 873 225 A1    1/2008
EP    2 141 215 A1    1/2010
(Continued)

OTHER PUBLICATIONS

European Office Action mailed Dec. 13, 2013, issued in corresponding European Application No. 11780485.6-1351 / 2570400.

*Primary Examiner* — Carol M Koslow
(74) *Attorney, Agent, or Firm* — Stein IP, LLC

(57) ABSTRACT

A method of producing β-SiAlON includes a sintering process, in which β-SiAlON starting materials, a mixture of silicon nitride, aluminum nitride, optically active element compound, and at least one compound selected from aluminum oxide and silicon oxide, are sintered at temperatures ranging from 1820° C. to 2200° C. The method provides new β-SiAlON low in carbon content and having high luminescence intensity by placing a plurality of boron nitride vessels in a graphite box to allow the β-SiAlON starting materials packed in the plurality of boron nitride vessels to easily come in contact with nitrogen gas, and performing sintering in nitrogen atmosphere.

8 Claims, 3 Drawing Sheets

(51) Int. Cl.
*C09K 11/64* (2006.01)
*C09K 11/77* (2006.01)
*C04B 35/597* (2006.01)
*C04B 35/626* (2006.01)
*C04B 35/64* (2006.01)
*H05B 33/14* (2006.01)
*H01L 33/50* (2010.01)
*C01B 21/082* (2006.01)

(52) U.S. Cl.
CPC . *C04B 2235/3865* (2013.01); *C04B 2235/3878* (2013.01); *C04B 2235/3895* (2013.01); *C04B 2235/422* (2013.01); *C04B 2235/658* (2013.01); *C04B 2235/6587* (2013.01); *C04B 2235/721* (2013.01); *C04B 2235/767* (2013.01); *C04B 2235/77* (2013.01); *C04B 2235/9646* (2013.01); *H01L 33/502* (2013.01)

USPC .................................................. 252/301.4 F

(56) References Cited

FOREIGN PATENT DOCUMENTS

| | | |
|---|---|---|
| JP | 2005-255885 | 9/2005 |
| JP | 2006-028295 | 2/2006 |
| JP | 2007-308605 | 11/2007 |
| JP | 2008-088266 | 4/2008 |
| JP | 2008-189811 | 8/2008 |
| JP | 2009-019213 | 1/2009 |
| WO | WO 2006/106948 | 10/2006 |
| WO | WO 2006/121083 | 11/2006 |

* cited by examiner

METHOD OF PRODUCING β-SIALON, β-SIALON, AND PRODUCTS USING THE SAME

CROSS-REFERENCE TO RELATED APPLICATIONS

This application is a national stage application of PCT Application No. PCT/JP2011/059858, filed Apr. 21, 2011, which claims the benefit of Japanese Application No. 2010-110865, filed May 13, 2010, in the Japanese Intellectual Property Office, the disclosures of which are incorporated herein by reference.

BACKGROUND OF THE INVENTION

1. Field of the Invention

The present invention relates to β-SiAlON, a method of producing the β-SiAlON, a phosphor using the β-SiAlON, and a light-emitting apparatus using the phosphor.

2. Description of the Related Art

As a phosphor for light-emitting devices (LED), β-SiAlON phosphor is known. The β-SiAlON phosphor is produced by filling a vessel made of boron nitride with starting materials, namely a mixture of, silicon nitride, aluminum nitride, at least one compound selected from aluminum oxide and silicon oxide, and optically active element compound as typified by europium oxide and cerium oxide, and subjecting the materials to sintering process where sintering is performed at temperatures ranging from 1820° C. to 2200° C.

As a technique of improving luminescence intensity of β-SiAlON phosphor, subjecting sintered and crashed materials obtained by sintering process to acid treatment is known (Patent Literature 1).

CITATION LIST

Patent Literature

Patent Literature 1: JP 2005-255885 A

SUMMARY OF THE INVENTION

Additional aspects and/or advantages of the invention will be set forth in part in the description which follows and, in part, will be obvious from the description, or may be learned by practice of the invention.

β-SiAlON is mass-produced by sintering a plurality of boron nitride vessels containing starting materials in a sintering furnace simultaneously. However, when β-SiAlON is mass-produced, β-SiAlON that does not have intended luminescence intensity might be produced in the plurality of boron nitride vessels unless temperature conditions, etc. within the sintering furnace are controlled, and consequently luminescence intensity becomes non-uniform.

Finding that the concentration of carbon contained in β-SiAlON affects luminescence intensity, the inventors achieved the present invention.

The objectives of the present invention include providing a method of producing β-SiAlON having improved quality, and decreasing the amount of carbon contained in the β-SiAlON, thereby providing β-SiAlON having high luminescence intensity. Another objective of the present invention is to provide a high-quality phosphor using the β-SiAlON, and yet another objective is to provide a high-intensity light-emitting apparatus using the phosphor.

The method of producing β-SiAlON of the present invention has a sintering process, in which β-SiAlON starting materials, namely a mixture of silicon nitride, aluminum nitride, at least one compound selected from aluminum oxide and silicon oxide, and optically active element compound, are sintered at temperatures ranging from 1820° C. to 2200° C. In this sintering process, the β-SiAlON starting materials packed in a plurality of boron nitride vessels are placed in a graphite box to allow the starting materials to easily come in contact with nitrogen gas, and sintering is performed in nitrogen atmosphere.

Another configuration of the method of producing β-SiAlON of the present invention has a sintering process, in which β-SiAlON starting materials, namely a mixture of silicon nitride, aluminum nitride, at least one compound selected from aluminum oxide and silicon oxide, and optically active element compound, are sintered at temperatures ranging from 1820° C. to 2200° C. In this sintering process, the β-SiAlON starting materials packed in a plurality of boron nitride vessels are placed in a graphite box to allow the starting materials to easily come in contact with nitrogen gas, and sintering is performed in nitrogen atmosphere with the top part of the graphite box opened.

In the method of producing β-SiAlON of the present invention described above, it is desirable that the optically active element compound be europium oxide.

The β-SiAlON of the present invention is represented by a general formula $Si_{6-z}Al_zO_zN_{8-z}$, contains Eu, and its carbon concentration is 200 ppm or lower. More preferably, the carbon concentration is 150 ppm or lower.

Another invention is a phosphor using this β-SiAlON.

Yet another invention is a light-emitting apparatus having the phosphor using the β-SiAlON and a luminescent light source.

According to the method of producing β-SiAlON of the present invention, high-quality β-SiAlON having high luminescence intensity can be produced at high productivity.

The β-SiAlON of the present invention is excited in a wide wavelength range from ultraviolet light to visible light, and is excellent as a high-efficiency green light-emitting phosphor having dominant wavelength falling within the range from 520 nm to 550 nm. Consequently, it is applicable favorably to various light-emitting devices, light-emitting apparatuses using ultraviolet LED or blue LED as a light source, in particular.

Since the β-SiAlON has high luminescence intensity, the light-emitting apparatus of the present invention experiences little reduction in brightness even if it is used at high temperatures, and has long service life.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
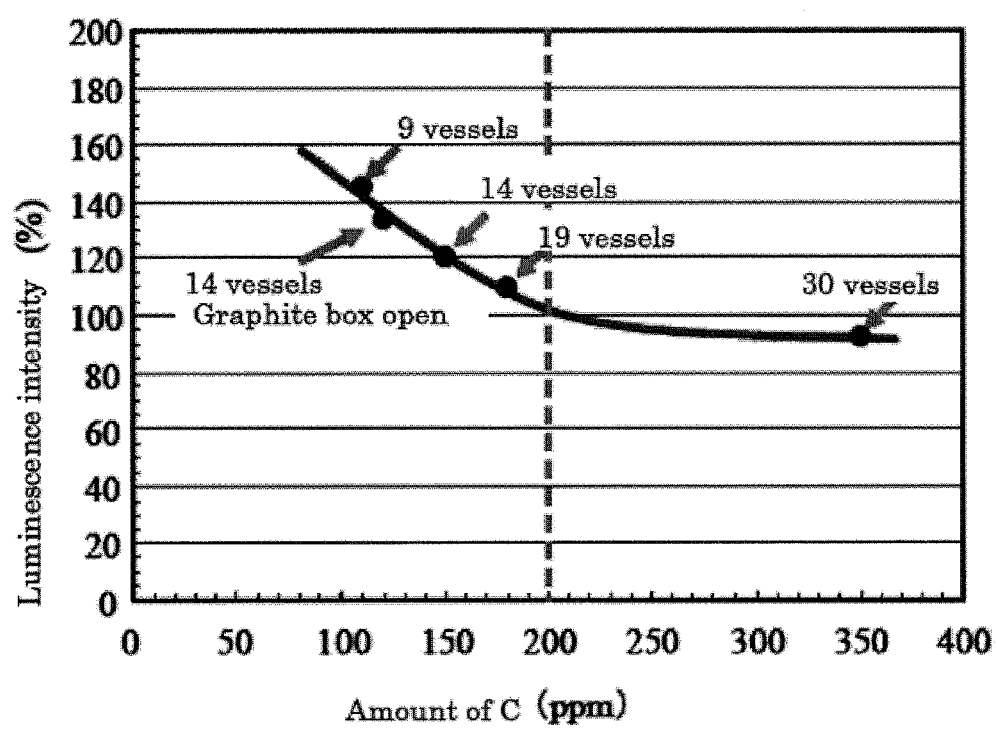
FIG. 1 is a chart showing the relation between carbon concentrations and luminescence intensity of the powder phosphor obtained in example 1 of the present invention.

Reference will now be made in detail to the present embodiments of the present invention, examples of which are illustrated in the accompanying drawings, wherein like reference numerals to the like elements throughout. The embodiments are described below in order to explain the present invention by referring to the figures.

The embodiment of the present invention will hereinafter be described in detail.

<Method of Producing β-SiAlON>

The method of producing β-SiAlON of the present invention has a sintering process, in which β-SiAlON starting materials, namely a mixture of silicon nitride, aluminum nitride, optically active element compound, and at least one of compound selected from aluminum oxide and silicon oxide, are sintered at temperatures ranging from 1820° C. to 2200° C., and wherein a plurality of boron nitride vessels are placed in a graphite box to allow the β-SiAlON starting materials packed in the plurality of boron nitride vessels to easily come in contact with nitrogen gas, and that sintering is performed in nitrogen atmosphere with the top part of the graphite box opened.

The boron nitride vessels used for the sintering process may take any shape, from cube and cuboid to cylindrical form, but to ensure uniform thermal propagation, cylindrical or spherical shape is desirable, and with stability taken into consideration, cylindrical shape is preferable. It is desirable that the size of the vessel falls within a range where uniform thermal propagation is ensured. In the case of cylindrical shape, its internal diameter desirably falls within the range from 5 cm to 8 cm and the height of the inner wall falls within a range from 5 cm to 8 cm.

The graphite box is in a shape of a box made of graphite plate, has a size capable of housing a plurality of boron nitride vessels, and has an opening at the top. The size of the graphite box is, in the case of box shape, is 51 cm deep, 31 cm wide, and 20 cm high in internal dimensions, for example. Since the top part of the graphite box is opened, the β-SiAlON starting materials packed in the plurality of boron nitride vessels remain in a state where contact with nitrogen gas is facilitated, and are sintered in nitrogen atmosphere. The concentration of carbon contained in the β-SiAlON produced is low, and β-SiAlON having high luminescence intensity can be obtained.

In the present invention, "β-SiAlON starting materials are placed in a graphite box to allow the starting materials to easily come in contact with nitrogen gas" is defined as adopting at least one means from the following three means: placing the boron nitride vessels along the wall of the graphite box; placing the boron nitride vessels in a row without stacking them on top of each other; and allowing the starting material powder filling rate, which is the ratio of total volume of the starting material powder to the internal volume of the graphite box, to be 2% or lower. The total volume of the starting material powder can be calculated from the total weight of the starting material powder and the density of the β-SiAlON (3.2 g/cm$^3$).

It is desirable that pressure of nitrogen gas in the sintering process be increased in the producing atmosphere. By increasing the pressure of nitrogen, disposition of the starting materials during the sintering process can be stabilized.

The content of carbon in the β-SiAlON produced under the above conditions becomes 200 ppm or lower, and the luminescence intensity becomes equivalent to or higher than that of commercially available YAG:Ce (Kasei Optonix, YAG:Ce [grade name: P46Y3]).

In the present invention, it is desirable that the β-SiAlON having undergone the sintering process be subjected to reheating process performed in argon atmosphere at atmospheric pressure at temperatures ranging from 1450° C. to 1600° C.

In the present invention, it is desirable that the β-SiAlON having undergone the sintering process or reheating process be subjected to acid treatment. The acid treatment in the present invention means to allow the β-SiAlON to disperse in an acid solution, agitate the solution for several minutes to several hours to cause reaction to occur, and then wash the β-SiAlON with water. By performing acid treatment, the luminescence inhibitor that appeared as a result of change caused by heating is removed by dissolving, and consequently fluorescence property can be improved. The acids used for acid treatment include one or more types of acids selected from hydrofluoric acid, sulfuric acid, phosphoric acid, hydrochloric acid, and nitric acid.

<β-SiAlON>

The β-SiAlON of the present invention has β-SiAlON host crystal represented by general formula $Si_{6-z}Al_zO_zN_{8-z}$, with one or more elements selected from Eu, Mn, Sm, and Ce contained in it as luminescent center. In particular, the one containing Eu is desirable because excitation occurs in a wide wavelength range from ultraviolet to visible light.

The carbon concentration of the β-SiAlON of the present invention measured by the infrared absorption method is 200 ppm or lower. If the amount of carbon contained in the β-SiAlON is large, decrease in luminescence intensity occurs, thereby inhibiting absorption of light into $Eu^{2+}$, the luminescent center. Namely, the β-SiAlON having carbon concentration of 200 ppm or lower has high luminescence intensity. More preferable carbon concentration is 150 ppm or lower.

The lattice constant of the β-SiAlON of the present invention depends largely on z value, namely the number of substitution of Si—N coupling by Al—O coupling. In other words, it is desirable that lattice constant "a" fall within the range from 0.7605 nm to 0.7620 nm, and lattice constant "c" fall within the range from 0.2908 nm to 0.2920 nm. The larger the size of crystal lattice of the β-SiAlON, the larger the amount of Eu contained. In particular, the ranges of lattice constants "a" and "c" shown above are desirable because the amount of Eu necessary for ensuring sufficient brightness can be contained easily.

It is only necessary that the Eu content of the β-SiAlON of the present invention falls within a range allowing sufficient luminescent brightness to be obtained. A range from 0.1 mass % to 3 mass %, for example, is desirable.

<Light-Emitting Apparatus>

The light-emitting apparatus of the present invention includes a phosphor produced by the β-SiAlON described above and a luminescent light source. Using this light-emitting apparatus, light is irradiated to the β-SiAlON, with ultraviolet light or visible light having wavelengths ranging from 350 nm to 500 nm used as an excitation source. By irradiation, the 13-SiAlON emits high-intensity light having its peak in wavelength falling within the range from 520 nm to 550 nm, allowing the light-emitting apparatus of the present invention to have high luminescence intensity. As the excitation source of the light-emitting apparatus, ultraviolet LED, blue LED, fluorescent lamp, or combination of those can be used. Furthermore, by combining the β-SiAlON phosphor with red light-emitting phosphor or blue light-emitting phosphor, the luminescent color can be made to be white or colors having other wavelengths.

Since the β-SiAlON of the present invention is low in decrease in brightness at high temperatures, the light-emitting apparatus using the same is also low in decrease in brightness and deviation in chromaticity, and degradation does not occur even at high temperatures. Furthermore, since it has excellent long-term stability in oxidizing atmosphere and hydric environment, the state of high brightness is extended.

The present invention will hereinafter be described further in detail by referring to examples.

Example 1

"Preparation of Starting Material Powder for Eu-Containing β-Sialon"

α-silicon nitride powder (Denki Kagaku Kogyo Kabushiki Kaisha, grade NP-400, oxygen content: 0.96 mass %), aluminum nitride powder (Tokuyama Corporation, grade F, oxygen content: 0.9 mass %), aluminum oxide powder (Taimei Chemicals Co., Ltd., grade TM-DAR), and europium oxide powder (Shin-Etsu Chemical Co., Ltd., grade RU) were mixed in percentage of 95.4%, 3.1%, 0.7%, and 0.8% by mass respectively to obtain 1 kg of starting material mixture.

The starting material mixture was agitated for 30 minutes in dry state using a V-type mixer, and the total amount of the mixture was then made to pass through a 150 µm nylon sieve to obtain starting material powder for synthesizing a phosphor.

Experiment 1

<Sintering Process>

100 g each of the starting material powder obtained as described above was packed in each of nine lidded cylindrical boron nitride vessels (Denki Kagaku Kogyo Kabushiki Kaisha, grade N-1) having internal diameter of 8 cm and height of 8 cm, and the vessels were placed in a graphite box with top lid having internal dimensions of 51 cm×31 cm and the height of 20 cm along its internal wall (starting material filling rate: 0.9%). Heat treatment was conducted at 2000° C. for 10 hours in a carbon heater electric furnace in 0.9 MPa pressurized nitrogen atmosphere, and the obtained powder was then cooled down gradually to room temperature. The sintered body obtained was a loosely coagulated mass, which was crashed lightly by human hands wearing clean rubber gloves. The lightly crashed sintered materials were made to pass through a 150 µm sieve to obtain 45 g of synthesized powder.

The starting material filling rate is a value obtained by dividing the total volume of starting material powder of 2,880 $cm^3$ by internal volume of the top-lidded graphite box of 31,620 $cm^3$ (51 cm×31 cm×20 cm), and the total volume of the starting material powder is a value obtained by dividing the total weight of the starting material powder of 900 g (9 vessels×weight of starting material powder per vessel of 100 g) by the density of β-SiAlON (3.2 $g/cm^3$). The starting material filling rate is specifically calculated by the following formula: Starting material filling rate 0.9%=((9×100)/3.2)/(51×31×20)

Experiment 2

Fourteen cylindrical boron nitride vessels containing starting materials were disposed in three 5-vessel rows, of which one row had four vessels only (starting material filling rate=1.4%). Treatment was performed under the same sintering process conditions as experiment 1 except for the above to obtain phosphor powder.

Experiment 3

The top lid of the graphite box was opened, and treatment was performed using the same number of vessels, sintering process and conditions as experiment 2 to obtain phosphor powder.

Experiment 4

Nineteen cylindrical boron nitride vessels containing starting materials were used, and three 5-vessel rows were disposed within a graphite box (starting material filling rate=1.9%), four more vessels were placed on the upper stage along the wall of the graphite box, and treatment was performed under the same sintering process conditions as experiment 1 to obtain phosphor powder.

Comparative Example 1

Thirty cylindrical boron nitride vessels containing starting materials were disposed within a graphite box in two rows at top and at bottom, with each row containing three 5-vessel rows (starting material filling rate=3.0%), and treatment was performed following the same treatment process and satisfying the same sintering process conditions as experiment 1 to obtain phosphor powder.

The luminescence intensity of the fluorescent powder in experiments 1 to 4 and comparative example 1 was measured using spectrofluoro-photometer (Hitachi High-Technologies Corporation, F4500). Table 1 shows the measurement result.

TABLE 1

| | Number of vessels (pcs.) | Lid of graphite box | Luminescence intensity (%) |
|---|---|---|---|
| Experiment 1 | 9 | Closed | 145 |
| Experiment 2 | 14 | Closed | 120 |
| Experiment 3 | 14 | Open | 133 |
| Experiment 4 | 19 | Closed | 109 |
| Com. Ex. 1 | 30 | Closed | 92 |

The luminescence intensity of the phosphor was calculated by the following operation.

The phosphor powder was placed in a 10 mm×10 mm×45 mm quartz cell having two transparent sides, tapping was performed 50 times. The cell orientation was changed by 180 degrees, and then tapping was performed 50 times again. The cell containing the phosphor powder was mounted to a cell folder installed within the sample chamber of the above device. Into this cell, monochromatic light dispersed from a luminescent light source (Xe lamp) to have a given wavelength was introduced. Light was irradiated to the phosphor sample with this monochromatic light used as an excitation source, and the luminescence intensity of the sample was measured using the spectrophotometer.

Blue light having wavelength of 455 nm was used in this example as the monochromatic light.

Luminescence intensity was represented by relative peak intensity (%), with the luminescence intensity of YAG:Ce (Kasei Optonix, P46Y3) regarded as 100%.

The concentration of carbon in starting material powder mixture and the fluorescent powder in experiments 1 to 4 and comparative example 1 were measured using a carbon analyzer (LECO Japan Corporation, IR-412). The carbon concentration of the phosphor was assessed as follows: 0.1 g of phosphor powder and 1.0 g of copper powder were placed in an alumina crucible, which was mounted to a sample stage.

Radio-frequency wave was irradiated to this cell to melt the phosphor. In oxidizing atmosphere, the gas discharged from the phosphor was measured by the infrared absorption method. Table 2 shows the measurement result.

TABLE 2

|  | Number of vessels (pcs.) | Lid of graphite box | Starting material power filling rate (%) | Carbon concentration (ppm) |
| --- | --- | --- | --- | --- |
| Starting material powder mixture | — | — | — | 800 |
| Experiment 1 | 9 | Closed | 0.9 | 110 |
| Experiment 2 | 14 | Closed | 1.4 | 150 |
| Experiment 3 | 14 | Open | 1.4 | 120 |
| Experiment 4 | 19 | Closed | 1.9 | 180 |
| Com. Ex. 1 | 30 | Closed | 3.0 | 350 |

Table 2 indicates that the concentration of carbon in the starting material powder mixture decreases if heat treatment is conducted at 2000° C. for 10 hours in pressurized nitrogen atmosphere of 0.9 MPa using a carbon heater electric furnace. Decrease in carbon concentration varied depending on the number of vessels and starting material powder filling rate.

As the starting material filling rate decreased, the carbon concentration was lower. In particular, if the starting material filling rate was 2% or lower, the carbon concentration was 200 ppm or lower, which is favorable.

In addition, when the vessels are disposed in two top and bottom rows, it is desirable that the vessels are disposed along the wall of the graphite box.

Furthermore, when sintering was performed in a state where the lid of the graphite box that housed the boron nitride vessels containing starting material powder for Eu-containing β-SiAlON was opened, the carbon content decreased.

FIG. 1 shows the relation between luminescence intensity and carbon concentrations.

Table 1, Table 2, and FIG. 1 show that by decreasing concentration of carbon contained in the synthesized powder, luminescence intensity increased. When carbon concentration was 200 ppm or lower, luminescence intensity was higher than that of YAG:Ce.

Example 2

Crashing Process

Figure 2:
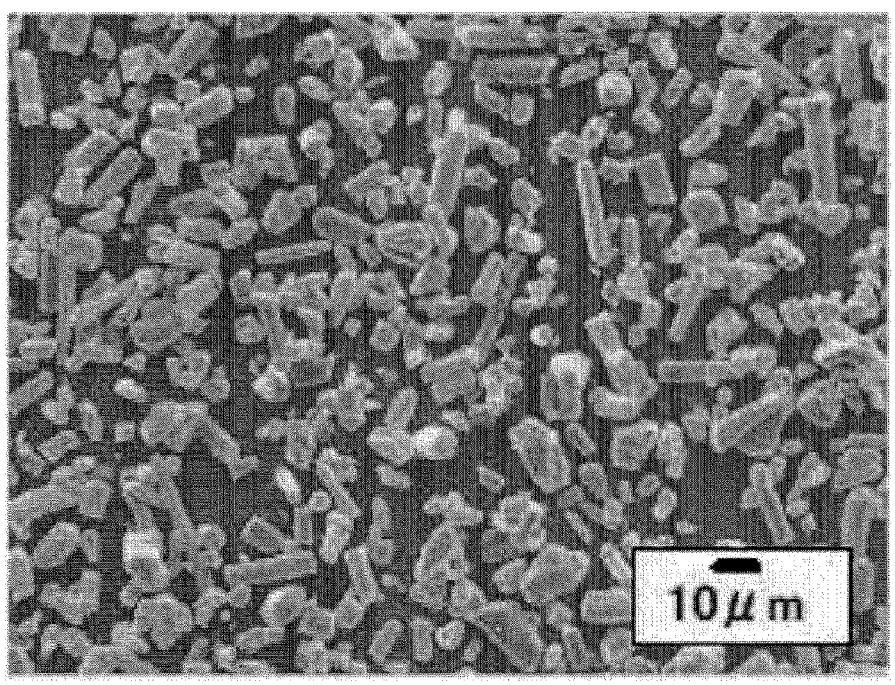
FIG. 2 is a chart showing a scanning electron microscopic image (SEM image) of the powder phosphor in example 2.

The synthesized powder obtained in experiment 1 was crashed using an ultrasonic jet crasher (Nippon Pneumatic Mfg. Co., Ltd., PJM-80SP) to obtain powder. FIG. 2 shows a scanning electron microscopic image (SEM image) of the powder obtained by crashing. Particle diameter of the powder obtained by crashing was controlled by adjusting the rate of supplying the sample to the crashing chamber of the crasher and the crashing air pressure.

Heat Treatment Process 15 g of powder obtained by crashing was packed in a lidded cylindrical boron nitride vessel having diameter of 40 mm and height of 45 mm (Denki Kagaku Kogyo Kabushiki Kaisha, grade N-1), and heat treatment was performed at 1450° C. for 8 hours in argon atmosphere at atmospheric pressure using a carbon heater electric furnace. The obtained powder showed no contraction resulting from annealing, had almost the same properties as those confirmed before heating, and all of the powder passed a 45 μm sieve.

Acid Treatment Process

The powder having undergone heat treatment was treated in 1:1 mixed acid solution made up of 50% hydrofluoric acid and 70% nitric acid solutions. The suspension liquid changed color during treatment from deep green to bright green. Then washing with water and drying were performed to obtain β-SiAlON powder.

Fine Powder Removal Process

The obtained β-SiAlON powder was subjected to fine powder removal process by the wet sedimentation method. In addition, after dispersing the phosphor powder in a solution to which hexameta sodium phosphate had been added as a dispersing agent, the solution was placed in a vessel, made to stand still, and the supernatant was removed. The above operations were repeated until the supernatant became transparent. The precipitate was then filtered, washed thoroughly with water to remove the dispersing agent, and dried to obtain β-SiAlON powder from which fine powder had been removed (experiment 5).

The synthesized powder in experiment 2 was treated following the same treatment process and satisfying the same conditions as in experiment 5 to obtain β-SiAlON powder (experiment 6).

Comparative Example 2

The synthesized powder in comparative example 1 was treated following the same treatment process and satisfying the same conditions as in experiment 5 to obtain β-SiAlON powder. By the producing method including crashing process, heat treatment process, acid treatment process, and classification process, β-SiAlON powder was produced (comparative example 2).

Table 3 shows the result of measurement of luminescence intensity of the β-SiAlON in experiments 5 and 6 and comparative example 2. The measurement was performed using the same method as example 1.

TABLE 3

|  | Number of vessels (pcs.) | Lid of graphite box | Luminescence intensity (%) |
| --- | --- | --- | --- |
| Experiment 5 | 9 | Closed | 238 |
| Experiment 6 | 14 | Closed | 229 |
| Com. Ex. 2 | 30 | Closed | 195 |

Figure 3:
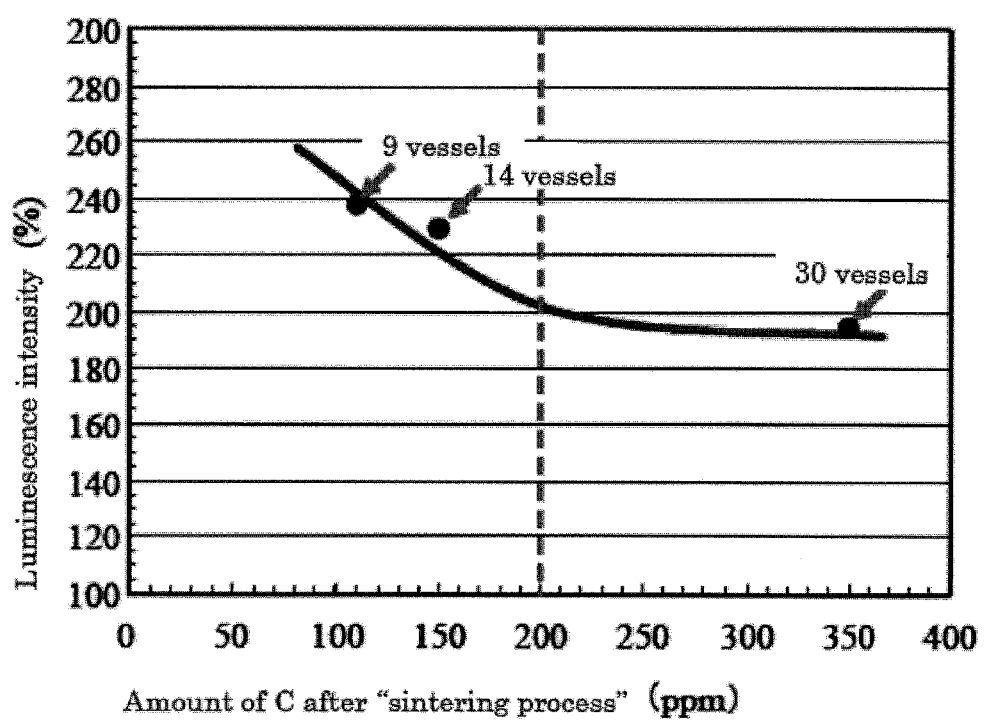
FIG. 3 is a chart showing the relation between carbon concentrations and luminescence intensity of the powder phosphor obtained in example 2.

FIG. 3 shows the relation between luminescence intensity and carbon concentrations in experiments 5 and 6 and comparative example 2.

Table 3 and FIG. 3 show that the tendency observed after the sintering process was also confirmed even if crashing process, heat treatment process, acid treatment process, and classification process were performed, and that sufficient luminescence intensity was not obtained unless the condition that the carbon concentration after the sintering process was 200 ppm or lower was satisfied.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of producing β-SiAlON, comprising a sintering process, in which β-SiAlON starting materials, a mixture of silicon nitride, aluminum nitride, optically active elemental compound, and at least one compound selected from aluminum oxide and silicon oxide, are sintered at temperatures ranging from 1820° C. to 2200° C., wherein a plurality of boron nitride vessels are placed in a graphite box to allow the β-SiAlON starting materials packed in the plurality of boron nitride vessels to easily come in contact with nitrogen gas, and that sintering is performed in nitrogen atmosphere.

2. A method of producing β-SiAlON, comprising a sintering process, in which β-SiAlON starting materials, a mixture of silicon nitride, aluminum nitride, optically active elemental compound, and at least one compound selected from aluminum oxide and silicon oxide, are sintered at temperatures ranging from 1820° C. to 2200° C., wherein a plurality of boron nitride vessels are placed in a graphite box to allow the β-SiAlON starting materials packed in the plurality of boron nitride vessels to easily come in contact with nitrogen gas, and that sintering is performed in nitrogen atmosphere with the top part of the graphite box opened.

3. The method of producing β-SiAlON as set forth in claim 1, wherein the total volume of the β-SiAlON starting materials packed in the plurality of boron nitride vessels accounts for 2% of the internal volume of the graphite box.

4. The method of producing β-SiAlON as set forth in claim 1, wherein the optically active element compound is europium oxide.

5. Eu-containing β-SiAlON represented by general formula $Si_{6-z}Al_zO_zN_{8-z}$, characterized in that its carbon concentration is 200 ppm or lower.

6. A light-emitting apparatus having the Eu-containing β-SiAlON as set forth in claim 5 and a luminescent light source.

7. The method of producing β-SiAlON as set forth in claim 2, wherein the total volume of the β-SiAlON starting materials packed in the plurality of boron nitride vessels accounts for 2% of the internal volume of the graphite box.

8. The method of producing β-SiAlON as set forth in claim 2, wherein the optically active element compound is europium oxide.

\* \* \* \* \*